United States Patent [19]

Bartlow

[11] Patent Number: 5,023,189
[45] Date of Patent: Jun. 11, 1991

[54] METHOD OF THERMAL BALANCING RF POWER TRANSISTOR ARRAY

[75] Inventor: Howard D. Bartlow, Sunnyvale, Calif.

[73] Assignee: Microwave Modules & Devices, Inc., Mountain View, Calif.

[21] Appl. No.: 519,136

[22] Filed: May 4, 1990

[51] Int. Cl.$^5$ .......................................... H01L 21/66
[52] U.S. Cl. .......................................... 437/8; 437/8; 437/923; 437/209; 324/158 R; 324/719
[58] Field of Search .................. 437/7, 8, 923, 209, 437/51

[56] References Cited

U.S. PATENT DOCUMENTS 4,246,697  7/1981  Smith ................................ 437/20 G
4,356,379  10/1982  Graeme ................................ 437/7
4,881,029  11/1989  Kawamura ............................ 437/8
4,937,203  7/1990  Eichelberger et al. .............. 437/8

Primary Examiner—Brian E. Hearn
Assistant Examiner—Trung Dang
Attorney, Agent, or Firm—Henry K. Woodward

[57] ABSTRACT

Thermal balance in an array of RF transistor cells in which all transistors are connected in parallel is obtained by interconnecting the transistors to array contacts by means of discrete wire leads. The array is electrically tested and a temperature distribution in the array is obtained. Thereafter, the wire leads are varied in length and height above the plane of the array to improve temperature distribution during test. The steps are repeated as necessary to obtain a desired temperature balance in the array.

7 Claims, 5 Drawing Sheets

METHOD OF THERMAL BALANCING RF POWER TRANSISTOR ARRAY

BACKGROUND OF THE INVENTION

This invention relates generally to RF power transistor arrays, and more particularly the invention relates to thermally balancing large-area, multi-cell transistor arrays.

Conventional power transistors comprise a cellular semiconductor die whose multiple device cells are interconnected in parallel. A common problem in such structures is thermal imbalances that result when individual devices in the multi-cell array operate unevenly. In the extreme, this condition results in thermal runaway, where collector current increases until device failure occurs.

A more common thermal instability is due to an internal thermal imbalance which causes the minority carrier collector current in a cell to crowd into one small portion of the active region and results in hot spots. If the temperature differential of the hot spot is great enough at sufficient high dissipation, a discontinuous change in the electrical characteristics of the transistor can occur, due to localized melting of the semiconductor.

These effects occur because the DC collector current of a transistor increases as the junction temperature increases. There are several sources of this positive temperature coefficient of collector current:

(1) If the base current is constrained by the circuit to be constant, the collector current increases with temperature because the DC common-emitter current gain increases with temperature.

(2) If the emitter-base voltage is constrained by the circuit to be constant, the emitter current, and thus the collector current, increases exponentially with temperature at a rate of about 8% per degree C.

Typical methods for connecting silicon RF power devices thermal imbalance involve the use of resistance losses (or feedback) to distribute the collector or emitter current more equally within the multi-cell structure. Two kinds of "ballast" resistor techniques are consistently used: emitter ballast or collector ballast. The emitter ballast technique consists of adding a small amount of lumped resistance in series with emitter sites before they are bussed together by interconnecting metallization and bondwires. Several Types of emitter ballast methods are used. The most common method involves an emitter resistor connected in series with each emitter finger. This resistor can be either a thin-film resistor or a diffused resistor.

Thin-film resistors are formed by etching gold (or other conductor metal, for example, aluminum) off of the emitter metal stripe, leaving a refractory barrier metal, which has high resistivity. Diffused resistors, as the name implies, are formed by a diffusion into the silicon crystal, which is contacted by the emitter metallization. The emitter ballast is simply an emitter feedback resistor deposited directly on the transistor chip that forces better current sharing. It also results in lower gain and somewhat higher saturation voltage.

The collector ballast technique is carried out by making the collector epitaxial region thicker than necessary in order to support the designed collector-base depletion layer. In effect, this results in a resistor in series with the collector regions under each active cell before they are electrically connected by the low-resistivity silicon substrate. The series resistance better distributes current under breakdown conditions. It also limits the current level. Collector ballast, therefore, makes the transistors more rugged under load mismatch, overvoltage, and over-drive conditions. However, while performance is improved, a lower saturated power and somewhat lower efficiency results.

Thus, there exists a need for providing a method of device ballasting that overcomes the problems and limitations attendant with prior-art techniques.

SUMMARY OF THE INVENTION

An object of the present invention is an improved method of thermally balancing an RF power transistor array without causing significant loss of power and efficiency.

Another object of the invention is a method of thermally balancing an RF power transistor array which is readily implemented during device fabrication.

A feature of the invention is the use of wire leads in interconnecting the RF power transistor array and the varying of wire length and wire height above the transistor array in achieving thermal balance.

Briefly, in carrying out the invention, semiconductor transistor chips are bonded to a supporting substrate in a conventional manner, then tested under DC and/or RF conditions to develop a thermal map of the cell-to-cell and intra-cell temperature distributions. This is readily accomplished by infrared scan, for example. Depending on the thermal map, emitter, base and collector wire leads are replaced to obtain necessary impedance changes for cell temperature balancing. The procedure is repeated as necessary to achieve the desired cell temperature balancing. The final bonding configuration is then used as a model for subsequent fabrication of the desired number of parts.

The invention and objects and features thereof will be more readily apparent from the following detailed description and appended claims when taken with the drawing.

DETAILED DESCRIPTION OF ILLUSTRATIVE EMBODIMENTS

Figure 1A:
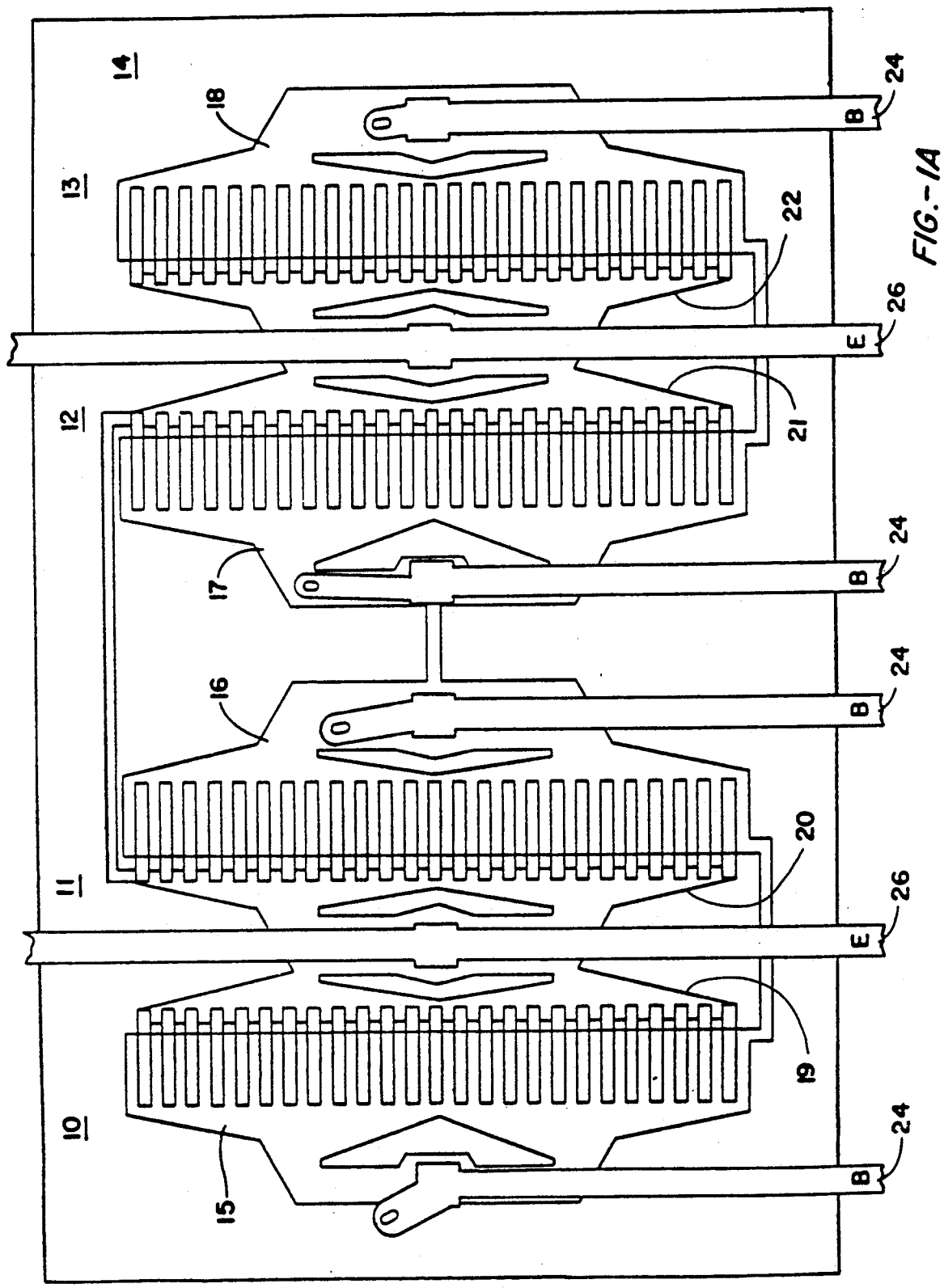
FIG. 1A and FIG. 1B are top views of two conventional RF power transistor arrays.
Figure 1B:
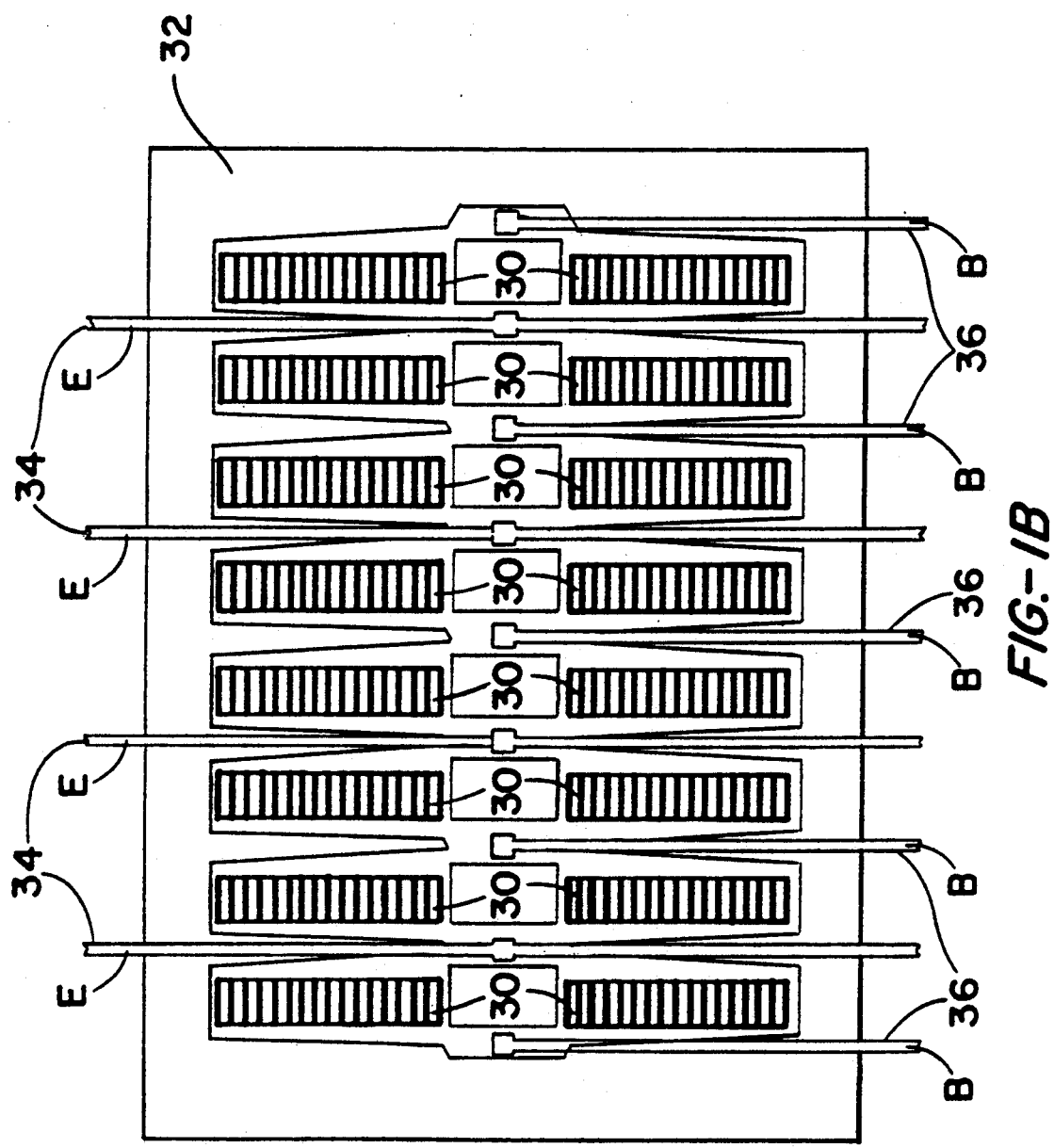

FIGS. 1A and 1B are top views of two RF power transistor arrays in which a plurality of semiconductor transistor cells are connected in parallel. In FIG. 1A, transistor cells 10-13, each having a plurality of transistors therein, are assembled on a supporting substrate 14 with all of the transistors connected in parallel. This is accomplished by base metallization 15-18 and emitter metallization 19-22 which respectively interconnect all bases in parallel and all emitters in parallel. Base leads 24 and emitter leads 26 interconnect the transistor elements to external contacts.

Similarly, in FIG. 1B, transistor cells 30 are assembled in a supporting substrate 32 with emitter leads 34 interconnecting all emitters and base leads 36 interconnecting all of the base elements of the transistors in the arrays 30.

As noted above, a common feature of all of the surface geometries used in the fabrication of silicon RF power devices is the thermal imbalance that results when the individual devices in the multi-cell structure operate unevenly. This condition can result in thermal runaway with attendant device failure.

Typical methods for correcting silicon RF power device thermal imbalance involve the use of ballast resistors to distribute the collector or emitter current more equally within the multi-cell structure and thereby even out the thermal distribution.

Figure 2A:
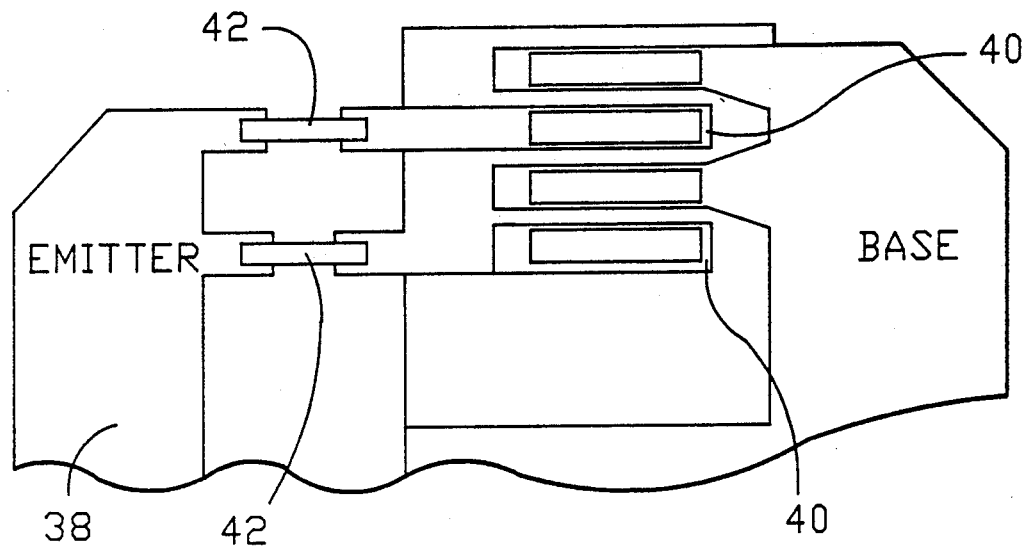
FIGS. 2A and 2B are a tip view and a section view, respectively, of a portion of an RF power transistor array using thin-film resistor ballast.
Figure 2B:
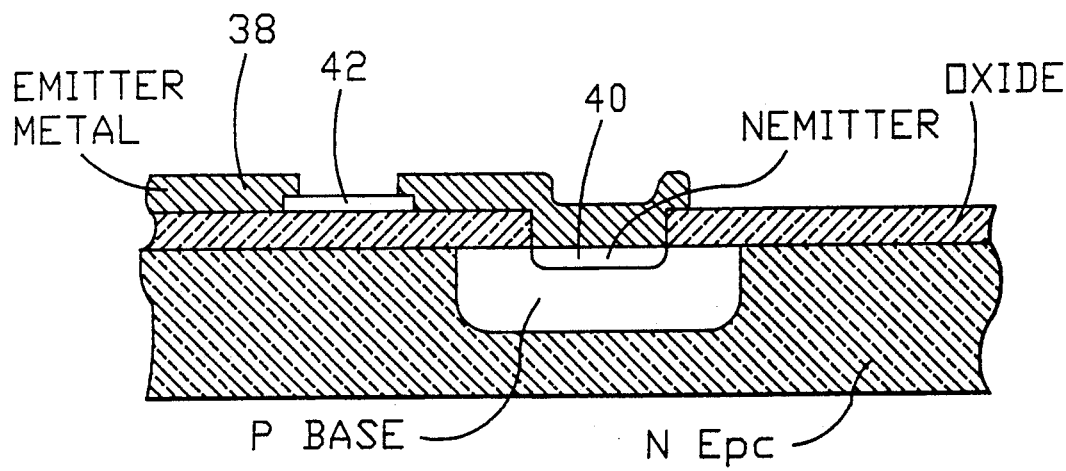

FIGS. 2A and 2B are a top view and section view, respectively, of a portion of an RF power transistor array in which the emitter connection 38 is interconnected to the emitters 40 through thin-film resistors 42.

Figure 3A:
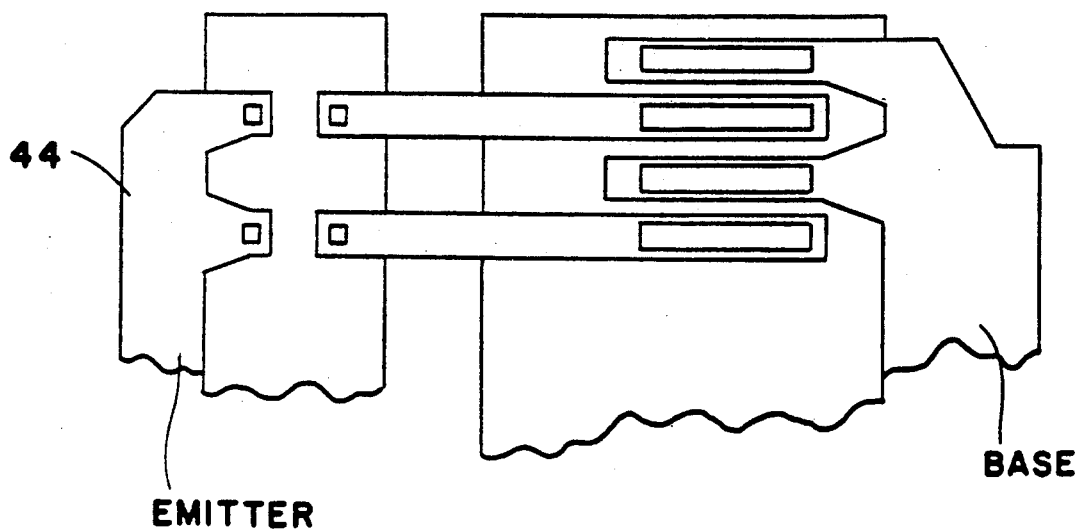
FIGS. 3A and 3B are a top and a section view, respectively, of a portion of an RF power transistor array using diffused resistor ballast.
Figure 3B:
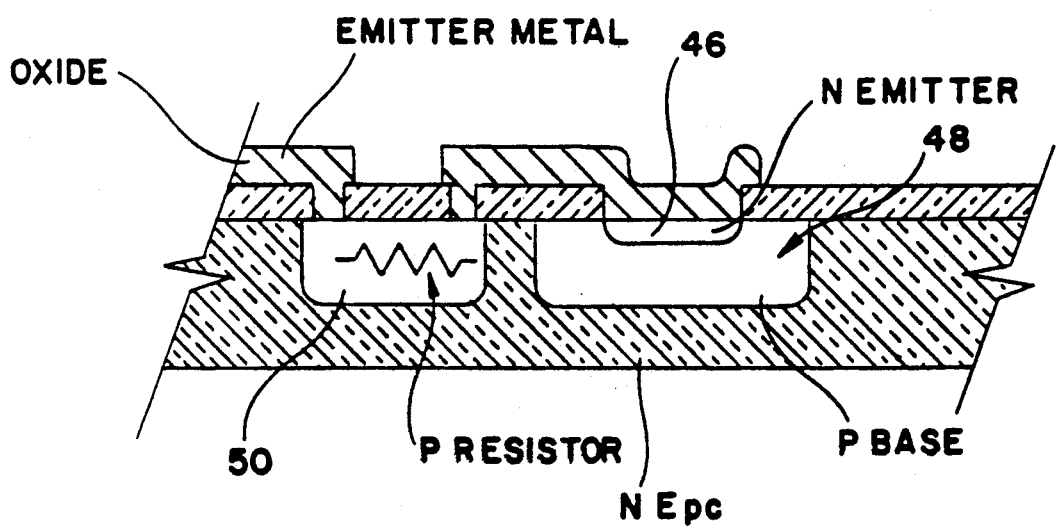

Similarly, in FIGS. 3A and 3B, a top view and a section view, respectively, of a portion of an RF power transistor array, the emitter lead 44 is interconnected to the emitter region 46 of bipolar transistor shown generally at 48 through a diffused resistor ballast 50. The emitter ballast technique adds a small amount of lump resistance in series with the emitter sites before the emitters are bussed together by interconnecting metallization and bondwires.

Similarly, a collector ballast technique is carried out by making the collector epitaxial region of a bipolar transistor thicker than necessary in order to support the designed collector-base depletion layer. In effect, this results in a resistor in series with the collector regions under each active cell before they are electrically connected by their low-resistivity silicon substrate. The series resistance better distributes current under breakdown conditions. It also limits the current level. Collector ballast, therefore, makes the transistors more rugged under load mismatch, over-voltage, and over-drive conditions. However, while performance is improved, a lower saturated power and somewhat lower efficiency results.

Figure 4:
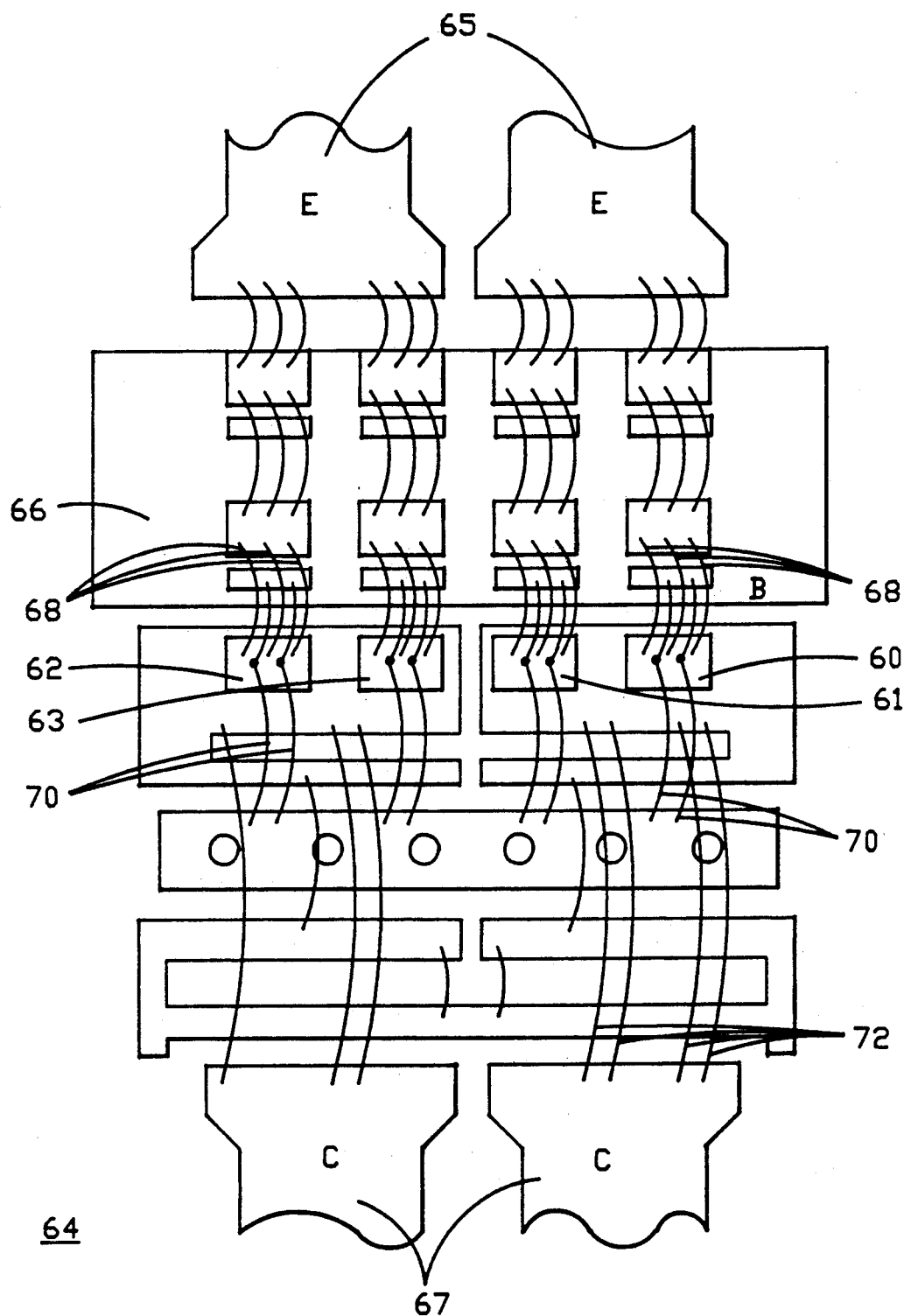
FIG. 4 is a top view of an RF power transistor array using variable-length wire leads in accordance with the present invention.

FIG. 4 is a top plan view of a portion of a semiconductor device array in accordance with the present invention. Transistor chips 60-63 are supported on a package substrate 64 in a conventional manner, and emitter leads 65, base leads 66, and collector leads 67 are provided on the surface of the substrate around the periphery of the chips 60-63. Lead wires 68 interconnect the emitter leads 65 to the emitter regions of the transistor cells 60-63, lead wires 70 interconnect the base lead 66 to the base regions of the semiconductor chips, and the lead wires 72 interconnect the collector regions of the transistors to the collector leads 67. After the wire bonding, the transistors are tested under DC and/or RF conditions and a thermal map of the cell-cell and intra-cell temperature distribution is obtained by infrared scan, for example. The collector, base and emitter leads are then removed and new bonding leads are applied in such a way as to obtain the desired impedance changes and cell temperature balancing. The procedure is repeated until a final bonding configuration is obtained which is then used for subsequent fabrication of the desired number of parts.

Typically, lengthening any input wire results in reduced power (and temperatures) to those cells fed by that input wire. Impedance to that section of the transistor is increased and less drive power gets to those cells. The opposite effect occurs when shortening the input wire. Common lead wires have a dual effect. For common emitter operation, longer emitter wires reduce power, gain, and temperature; however, in common base operation, longer base wires will increase power, gain and temperature.

Output wires control series output impedance which is used as a matching element in output circuit design. Typically, lengthening the output wire will reduce power and temperatures.

For some relatively narrow-band circuits, however, higher output impedance can improve efficiency and thereby reduce transistor temperature with no los of power. For reduction in the intra-cell temperature difference ($\Delta t$) of up to about 25° C. for a 12-cell device, length adjustments were as follows:

Collector current increased by 20-30 mils, height not adjusted.

Input wires increased 10-20 mils in length and 2-4 mils in height.

Common lead increased in length 5-15 mils and in height 2-4 mils.

The described method of thermal balancing an RF power transistor array by varying the length and height of lead wires is expeditious in implementation and minimizes deleterious effects in device operation characteristics.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

I claim:

1. A method of thermally balancing an array of RF bipolar transistors, connected in parallel, each transistor having emitter, base and collector contacts, said method comprising the steps of
   a) providing emitter, base and collector array contacts.
   b) interconnecting at least one of said emitter, base and collector contacts of said transistors to the respective emitter, base and collector array contacts by a plurality of wire leads,
   c) obtaining a measure of temperature distribution of said array of RF transistors during electrical test, and
   d) altering the lengths and heights of selected wire leads to improve temperature distribution in said array during electrical test.

2. The method as defined by claim 1 and further including
   e) repeating steps b), c), and d) as necessary to obtain a desired temperature balance in said array.

3. In thermally balancing an array of RF transistors connected in parallel, the method of
   interconnecting said transistors to array contacts by means of a plurality of discrete wire leads,
   determining the temperature distribution of said array during electrical test, and
   varying said plurality of discrete wire leads to improve thermal balance of said array.

4. The method as defined by claim 3 wherein said plurality of discrete wire leads is varied in length.

5. The method as defined by claim 4 wherein said plurality of wire leads are further varied in height above the plane of said array.

6. The method as defined by claim 3 wherein said plurality of wire leads are varied in height above the plane of said array.

7. The method as defined by claim 3 wherein the step of varying said plurality of wire leads adjusts current to said transistors more uniformly.

* * * * *